(12) United States Patent
Tanaka et al.

(10) Patent No.: US 8,043,096 B2
(45) Date of Patent: Oct. 25, 2011

(54) CONDUCTIVE RUBBER COMPONENT

(75) Inventors: Jinya Tanaka, Aichi (JP); Masakazu Koizumi, Aichi (JP)

(73) Assignee: Fuji Polymer Industries Co., Ltd., Nagoya-shi, Aichi (JP)

( * ) Notice: Subject to any disclaimer, the term of this patent is extended or adjusted under 35 U.S.C. 154(b) by 0 days.

(21) Appl. No.: 12/745,659

(22) PCT Filed: Jun. 11, 2009

(86) PCT No.: PCT/JP2009/060662
§ 371 (c)(1),
(2), (4) Date: Jun. 1, 2010

(87) PCT Pub. No.: WO2010/032521
PCT Pub. Date: Mar. 25, 2010

(65) Prior Publication Data
US 2010/0323767 A1 Dec. 23, 2010

(30) Foreign Application Priority Data
Sep. 16, 2008 (JP) ................. 2008-236519

(51) Int. Cl.
*H01R 12/00* (2006.01)
*H05K 1/00* (2006.01)
(52) U.S. Cl. .............. 439/66; 439/91; 439/591
(58) Field of Classification Search ........... 439/66, 439/91, 591; 174/351
See application file for complete search history.

(56) References Cited

U.S. PATENT DOCUMENTS

| | | | | |
|---|---|---|---|---|
| 3,998,513 A * | 12/1976 | Kobayashi et al. | ............ | 439/91 |
| 4,201,435 A * | 5/1980 | Nakamura et al. | ............ | 439/91 |
| 4,449,774 A * | 5/1984 | Takashi et al. | ............ | 439/590 |
| 5,846,094 A * | 12/1998 | Murray et al. | ............ | 439/91 |
| 6,235,986 B1 | 5/2001 | Reis et al. | ............ | 174/358 |
| 6,581,276 B2 * | 6/2003 | Chung | ............ | 29/825 |
| 6,729,888 B2 * | 5/2004 | Imaeda | ............ | 439/66 |
| 6,752,639 B1 * | 6/2004 | Kirkman et al. | ............ | 439/91 |
| 6,796,811 B1 * | 9/2004 | Pupkiewicz et al. | ............ | 439/86 |
| 2010/0000781 A1 * | 1/2010 | Tanaka et al. | ............ | 174/351 |

FOREIGN PATENT DOCUMENTS

| | | |
|---|---|---|
| JP | 2-62671 | 5/1990 |
| JP | 5-17943 | 3/1993 |
| JP | 2002-510873 | 4/2002 |
| JP | 2004-134241 | 4/2004 |
| JP | 2004-259488 | 9/2004 |
| WO | 99/51074 | 10/1999 |

OTHER PUBLICATIONS

Japanese Office Action issued in Japanese Application No. 2009-540536, mailed Nov. 26, 2009, 2 pages.

* cited by examiner

*Primary Examiner* — Hae Moon Hyeon
(74) *Attorney, Agent, or Firm* — Hamre, Schumann, Mueller & Larson, P.C.

(57) ABSTRACT

A conductive rubber component includes a laminate in which conductive rubber layers and insulating rubber layers are laminated alternately in parallel, and the conductive rubber layers and the insulating rubber layers are integrated at their boundaries by a cross-linking reaction. A solderable metal coating is integrated with at least one surface of the laminate that is perpendicular to the electrical conduction direction by the deposition of at least one selected from atoms and molecules. This conductive rubber component can have good compression load properties and good compression set properties, achieve a stable electric connection for a long period of time due to the good compression set properties, be soldered to a printed wiring board or the like because of the presence of the integrated metal coating, suppress the occurrence of burrs, reduce costs, and improve the production efficiency.

20 Claims, 5 Drawing Sheets

US 8,043,096 B2

CONDUCTIVE RUBBER COMPONENT

TECHNICAL FIELD

The present invention relates to a conductive rubber component, particularly a metal-integral conductive rubber laminate for electrically connecting a case and a printed wiring board. The present invention also relates to a conductive rubber component in which a solderable metal coating is integrated with at least one surface of the laminate.

BACKGROUND ART

In recent years, there have been problems with electromagnetic interference such as the malfunction of electronic equipment and the effect on a human body due to electromagnetic waves radiated from radio application equipment including a portable telephone. One of the measures against the electromagnetic interference is to dispose a conductive metal evaporated film on the inner surface of a resin body of a portable telephone for shielding purposes. The conductive metal evaporated film is effective as a shielding layer for preventing radiated electromagnetic noise from coming out of the portable telephone. In many cases, the conductive shielding layer is formed by a metal evaporation method, the application of a conductive coating, or the like. The conductive shielding layer needs to be connected electrically to a printed wiring board so that they are at the same potential. For this reason, a method has been employed in which spring metal contacts are fixed to an electrode on the printed wiring board, and the electrode is brought into contact with the conductive shielding layer to make an electric connection when the resin body is assembled (Patent Document 1).

Another method also has been proposed in which a metal foil or the like is integrated with one surface of conductive rubber, and then this conductive rubber is fixed on a printed wiring board using a conductive adhesive or other means to make an electric connection (Patent Documents 2 to 3).

The conductive rubber of such a component is produced by mixing insulating rubber and a large amount of conductive filler. Since the conductive rubber contains a large amount of conductive filler, the proportion of rubber in the entire volume is reduced. Thus, the rubber hardness becomes higher, and the initial compression load is increased. At the same time, the conductive rubber is likely to lose rubber elasticity or restoring force. Moreover, the conductive rubber significantly sacrifices the compression set properties, which are the important rubber properties. Consequently, the conductive rubber component is weakened and broken from the compression for a long period of time, and cannot be restored. Further, the resiliency of the conductive rubber is degraded, so that the electric connection to be maintained by the resiliency cannot be maintained in the end.

The conventional method generally includes integrating two materials with dearly different physical properties, i.e., a metal and an elastomer and cutting the resultant product to a desired size. However, when a sheet obtained by laminating the conductive rubber and the metal foil that differ in physical properties (e.g., rigidity and Young's modulus) is cut, burrs are likely to occur at the end of the product. This will be described with reference to the drawing. FIG. 9 is a cross-sectional view of a conventional laminate of conductive rubber and a metal foil. Conductive rubber 4 is laminated with a conductive adhesive layer 5, a primer layer 6, and a metal foil 7, and then integrated together. This laminate 11 is in the form of a sheet, and at least one end face is cut. Thus, a burr 8b occurs at the cut surface. As indicated by the arrow b in FIG. 9, the burr 8b is 80 μm or more in size and can increase the possibility of a defect that causes conductive anomaly, i.e., the product is mounted obliquely during reflow mounting.

PRIOR ART DOCUMENTS

Patent Documents

Patent document 1: JP 2004-134241 A
Patent document 2: JP 2002-510873 A
Patent document 3: JP 2004-259488 A

DISCLOSURE OF INVENTION

Problem to be Solved by the Invention

To solve the above problems of the conventional conductive rubber component, it is an object of the present invention to provide a conductive rubber component that can have good compression load properties and good compression set properties, achieve a stable electric connection for a long period of time due to the good compression set properties, be soldered to a printed wiring board or the like because of the presence of an integrated metal coating, suppress the occurrence of burrs, reduce costs, and improve the production efficiency.

Means for Solving Problem

A conductive rubber component of the present invention includes a laminate in which conductive rubber layers and insulating rubber layers are laminated alternately in parallel, the conductive rubber layers and the insulating rubber layers are integrated at their boundaries by a cross-linking reaction between the conductive rubber layers and the insulating rubber layers, the conductive rubber layers have a thickness of 0.01 mm to 1.0 mm and electrical conductivity such that the volume resistivity is $10^{-5}$ Ω·cm or more and 10 K Ω·cm or less, and the insulating rubber layers have a thickness of 0.01 mm to 1.0 mm and electrical insulation properties such that the volume resistively is 1 M Ω·cm or more and $10^{16}$ Ω·cm or less. A solderable metal coating is integrated with at least one surface of the laminate that is perpendicular to the electrical conduction direction by the deposition of at least one selected from atoms and molecules.

Effects of the Invention

The present invention can provide a conductive rubber component provided with a metal coating that can have good low-load properties and good compression set properties, achieve a stable electric connection for a long period of time, and be soldered to a printed wiring board. Moreover, the production cost is low, and the production efficiency is improved. The conductive rubber component provided with the metal coating is suitable for a means for electrically connecting, e.g., a printed wiring board and a conducting surface on the inside of a resin body of a portable telephone. Even when the metal coating is integrated with the conductive rubber and then formed into a desired size by cutting the periphery, burrs are not likely to occur from the metal coating. Consequently, the conductive rubber component can reduce a defect that causes conductive anomaly, i.e., the product is mounted obliquely during reflow mounting.

DESCRIPTION OF THE INVENTION

Figure 1:
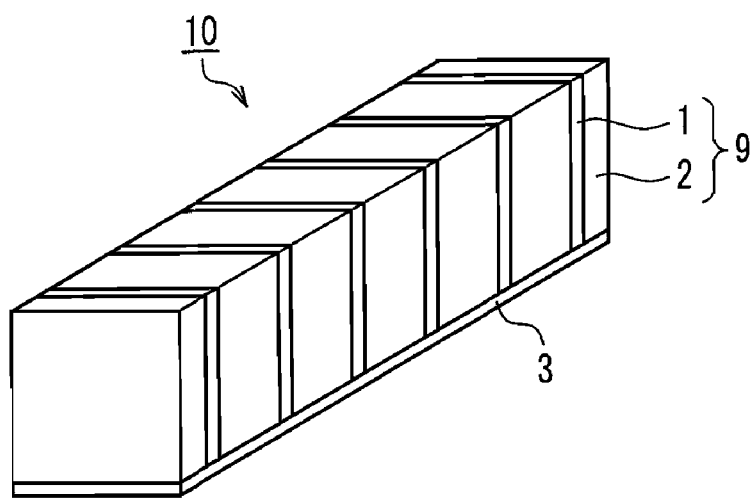
FIG. 1 a perspective view of a metal-integral conductive rubber component of an example of the present invention.

A laminate constituting a conductive rubber component of the present invention is configured so that conductive rubber layers and insulating rubber layers are laminated alternately in parallel, and the conductive rubber layers and the insulating rubber layers are cured and integrated at their boundaries by a cross-linking reaction. The volume resistivity of the conductive rubber layers is $10^{-5}$ Ω·cm or more and 10 K Ω·cm or less, and preferably $10^{-4}$ Ω·cm or more and 1 K Ω·cm or less. With this range, e.g., the conductive metal evaporated film on the inner surface of the resin body of a portable telephone can be connected electrically to a printed wiring board. The thickness of the conductive rubber layers is in the range of 0.01 mm to 1 mm, and preferably 0.01 mm to 0.5 mm. This range also can ensure the electric connection. The insulating rubber layers have electrical insulation properties such that the volume resistivity is 10 M Ω·cm or more and $10^{16}$ Ω·cm or less, and preferably 100 M Ω·cm or more and $10^{14}$ Ω·cm or less. With this range, both good low-load properties and good compression set properties can be maintained. The thickness of the insulating rubber layers is in the range of 0.01 mm to 1 mm, and preferably 0.01 mm to 0.5 mm. This range also can ensure both good low-load properties and good compression set properties.

The material of the conductive rubber may be selected from an organic synthetic rubber such as a butadiene polymer (BR: classification by ASTM D1419, the following abbreviations are also the same), a butadiene-styrene copolymer (SBR), a butadiene-acrylonitrile copolymer (NBR), an isoprene polymer (IR), a chloroprene polymer (CR), an isobutylene-diene copolymer (IIR), an ethylene-propylene copolymer (EPM), an ethylene-propylene terpolymer (EPDM), chlorosulfonated polyethylene (CSM), an alkylene sulfide polymer (T), an alkylsiloxane condensation product (Si), vinylidene fluoride, and a propylene hexafluoride copolymer (FPM). A preferred example is the alkylsiloxane condensation product that is commercially available as a silicone rubber compound or liquid silicone, and any materials can be used as long as they are converted into a rubber elastic body by curing. Moreover, it is particularly preferable to use materials that can be mixed with a conductive powder and easily have conductivity such as the alkylsiloxane condensation product or silicone rubber.

The silicone rubber is organopolysiloxane that has at least two aliphatic unsaturated groups and is expressed as a chemical formula $R_n SiO_{(4-n)/2}$ (where R represents the same or different type of unsubstituted or substituted monovalent hydrocarbon group (with a carbon number of 1), and n is a positive number of 1.98 to 2.02. The same is true in the following).

A conductive filler that is mixed with the silicone rubber to impart conductivity may be obtained, e.g., by processing carbon, copper, a copper alloy, nickel, titanium, gold, silver, or an alloy thereof into particles or by forming a metal conductive layer on the surface of a core material by plating or vapor deposition. The average particle size of the conductive filler is preferably 1.0 μm to 50 μm, and more preferably 4.2 μm to 17.0 μm. It is particularly preferable to use a silver coated glass powder with an average particle size of 1.0 μm to 50 μm, and more preferably 10 μm or less. This average particle size can be measured, e.g., using a laser diffraction particle size analyzer LA920 (manufactured by Horiba, Ltd.) or SALD2100 (manufactured by Shimadzu Corporation).

A clay-like conductive rubber compound including the silicone rubber and the conductive filler may be cured by a curing mechanism of an addition reaction that uses as a curing agent either an organic peroxide or organohydrogenpolysiloxane and a platinum catalyst. Ultimately, it is possible to select the curing mechanism that allows the conductive rubber compound to be thermally cured and also to have an electrically stable volume resistivity. For example, the conductive rubber compound is cured preferably by a radical reaction using 2,5-dimethyl-2,5-di(tert-butylperoxy)hexane as a curing agent.

The material of the insulating rubber may be selected from organic synthetic rubber such as a butadiene polymer (BR: classification by ASTM D1419), a butadiene-styrene copolymer (SBR), a butadiene-acrylonitrile copolymer (NBR), an isoprene polymer (IR), a chloroprene polymer (CR), an isobutylene-diene copolymer (IIR), an ethylene-propylene copolymer (EPM), an ethylene-propylene terpolymer (EPDM), chlorosulfonated polyethylene (CSM), an alkylene sulfide polymer (T), an alkylsiloxane condensation product (Si), vinylidene fluoride, and a propylene hexafluoride copolymer (FPM), and any materials can be used as long as they are converted into a rubber elastic body by curing. A preferred example is the alkylsiloxane condensation product that is commercially available as a silicone rubber compound or liquid silicone. The silicone rubber is organopolysiloxane that has at least two aliphatic unsaturated groups and is expressed as a chemical formula $R_n SiO_{(4-n)/2}$ (where R represents the same or different type of unsubstituted or substituted monovalent hydrocarbon group (with a carbon number of 1), and n is a positive number of 1.98 to 2.02).

The insulating rubber may be cured by a curing mechanism of an addition reaction that uses as a curing agent either an organic peroxide or organohydrogenpolysiloxane and a platinum catalyst. Ultimately, it is possible to select the curing mechanism that allows the insulating rubber to be thermally cured and also to have an electrically stable volume resistivity. For example, the insulating rubber is cured preferably by a radical reaction using 2,5-dimethyl-2,5-di(tert-butylperoxy)hexane as a curing agent. The above-described conductive rubber layers and insulating rubber layers are laminated alternately in parallel, and then cured and integrated at their boundaries by a cross-linking reaction, thus providing a rubber laminate.

It is preferable that an insulating support rubber layer with a JIS hardness (JIS K6253) of 55 degrees or less is disposed on at least one side of the laminate of the conductive rubber layers and the insulating rubber layers. This configuration can reduce the compression load on the laminate.

The support rubber layer has insulation properties such that the volume resistivity is preferably 10 M Ω·cm or more and $10^{16}$ Ω·cm or less. The material of the support rubber may be selected from organic synthetic rubber such as a butadiene polymer (BR: classification by ASTM D1419), a butadiene-styrene copolymer (SBR), a butadiene-acrylonitrile copolymer (NBR), an isoprene polymer (IR), a chloroprene polymer (CR), an isobutylene-diene copolymer (BR), an ethylene-propylene copolymer (EPM), an ethylene-propylene terpolymer (EPDM), chlorosulfonated polyethylene (CSM), an alkylene sulfide polymer (T), an alkylsiloxane condensation product (Si), vinylidene fluoride, and a propylene hexafluoride copolymer (FPM), and any materials can be used as long as they are converted into a rubber elastic body by curing. A preferred example is the alkylsiloxane condensation product that is commercially available as a silicone rubber compound or liquid silicone. The silicone rubber is organopolysiloxane that has at least two aliphatic unsaturated groups and is expressed as a chemical formula $R_n SiO_{(4-n)/2}$ (where R represents the same or different type of unsubstituted or substituted monovalent hydrocarbon group (with a carbon number of 1), and n is a positive number of 1.98 to 2.02).

The support rubber may be cured by a curing mechanism of an addition reaction that uses as a curing agent either an organic peroxide or organohydrogenpolysiloxane and a platinum catalyst. Ultimately, it is possible to select the curing mechanism that allows the support rubber to be thermally cured and also to have an electrically stable volume resistivity. For example, the support rubber is cured preferably by a radical reaction using 2,5-dimethyl-2,5-di(tert-butylperoxy) hexane as a curing agent. Thus, the support rubber and each of the insulating rubber layers and the conductive rubber layers are cured and integrated at their boundaries by a cross-linking reaction, thus providing a rubber laminate.

In the present invention, a metal coating is applied to at least one surface of the conductive rubber laminate that is perpendicular to the electrical conduction direction. The metal coating is formed by atomic or molecular deposition. The metal atoms or metal molecules may be deposited, e.g., by sputtering, vapor deposition, ion plating, or plating. In a sputtering method, e.g., plasma is produced by applying a voltage of several hundred V to several kV between a substrate or a vacuum chamber (ground) and a target at 10 to $10^{-4}$ Pa, and then the metal atoms and/or metal molecules are sputtered and deposited on the substrate that is located near the target. In this case, the substrate serves as the conductive rubber laminate. The sputtering method is suitable for the present invention. The vapor deposition, ion plating, and plating are well known in general, and any known methods can be used.

The material of the metal coating is any metal selected from gold, platinum, silver, copper, nickel, titanium, chromium, aluminum, and palladium or an alloy thereof. These materials are deposited preferably by the sputtering method on at least one surface of the conductive rubber laminate that is perpendicular to the electrical conduction direction. The thickness of the metal coating is preferably 0.05 μm to 4 μm, and more preferably 0.8 μm to 1.2 μm.

It is preferable that a silane coupling agent is applied to the surface of the conductive rubber laminate on which a metal coating is to be formed as an adhesion assistant to anchor the metal coating firmly with the conductive rubber laminate. The silane coupling agent (adhesion assistant) may be applied so as not to affect the electrical conduction between the laminate and the metal coating, and may act to improve the adhesion between them. The silane coupling agent applied to the surface of the laminate is hydrolyzed, and a dehydration condensation reaction occurs between the silanol group and M-OH (M represents silicon or a metal atom) of the surface of the metal coating. This reaction serves to bond the surface of the metal coating and the conductive rubber together. The silane coupling agent can be a material expressed as a general formula $YSiX_3$. In this case, X represents a methyl group or an ethyl group, and Y represents an aliphatic long chain alkyl group having a carbon number of 2 or more. Typical examples include vinyltriethoxysilane, vinyltris(2-methoxyethoxy)silane, 3-methacryloxypropyltrimethoxysilane, 3-glycidoxypropyltrimethoxysilane, N-2-(aminoethyl)3-aminopropyltrimethoxysilane, N-phenyl-3-aminopropyltrimethoxysilane, 3-mercaptopropyltrimethoxysilane, and 3-chloropropyltrimethoxysilane, which are commercially available as the silane coupling agent. These materials can be selected appropriately in accordance with the materials of the laminate and used individually or in combinations of two or more. However, the materials that may prevent the electrical conduction between the laminate and the metal coating are not suitable.

It is preferable that the surface provided with the metal coating and its opposite surface are parallel to each other and substantially the same in shape. When a compression load is imposed in the direction between the surface provided with the metal coating and its opposite surface, such a shape can make the compression load uniform.

The metal coating is any metal selected from gold, platinum, silver, copper, nickel, titanium, chromium, aluminum, and palladium or an alloy thereof. These metals or alloys may be deposited as either a single layer or two or more layers. It is preferable that the metal coating is formed by the sputtering method and has a thickness of 0.05 μm to 4 μm and a flatness of 0.05 μm or less. This can facilitate the surface mounting using an adsorber and solder reflow.

It is preferable that the conductive rubber component provided with the metal coating is accommodated in a carrier tape including recesses. Thus, the conductive rubber component can be mounted automatically on the printed wiring board with efficiency.

Figure 2:
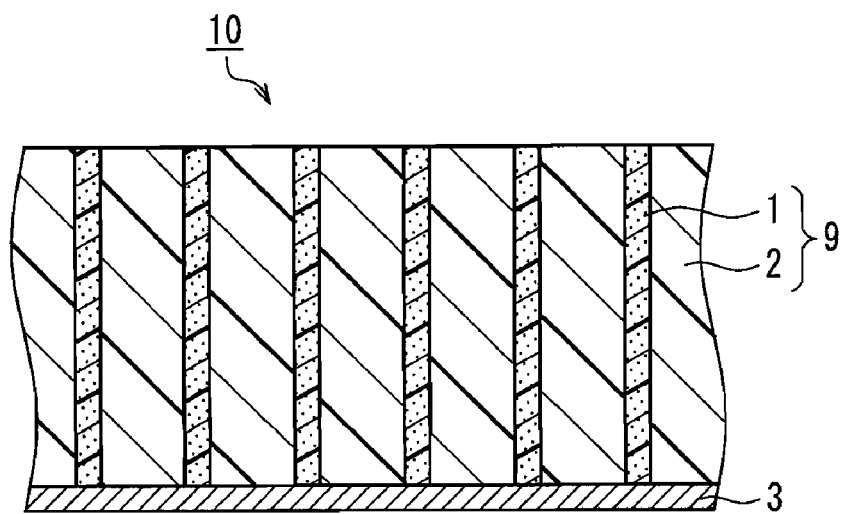
FIG. 2 is a cross-sectional view of the metal-integral conductive rubber component in FIG. 1.

The present invention will be described with reference to the drawings. FIG. 1 is a perspective view of a conductive rubber component 10 provided with a metal coating of an example of the present invention. FIG. 2 is a cross-sectional view of the conductive rubber component 10 in FIG. 1. In FIGS. 1 to 2, conductive rubber layers 1 and insulating rubber layers 2 are laminated alternately in parallel. The conductive rubber layers 1 and the insulting rubber layers 2 are integrated at their boundaries by a cross-linking reaction. Specifically, the conductive and insulating rubber layers in the uncured state are laminated, and then cured under pressure, so that the both layers are integrated at their boundaries by a curing reaction. In other words, the conductive rubber layers 1 and the insulating rubber layers 2 self-adhere to each other by cross-linking. Thus, a conductive rubber laminate 9 is provided.

A solderable metal coating 3 is integrated with at least one surface of the conductive rubber laminate 9 that is perpendicular to the electrical conduction direction of the conductive rubber layers 1 by the sputtering method. A given conductive rubber layer and its adjacent conductive rubber layer are connected electrically via the solderable metal coating 3.

Figure 3:
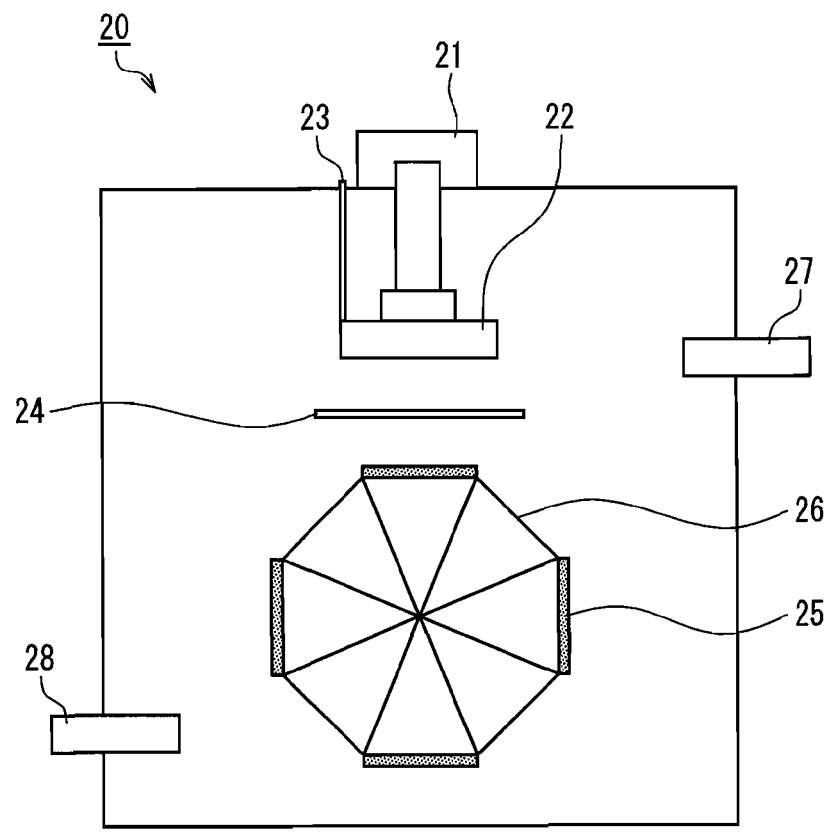
FIG. 3 is a schematic diagram showing a sputtering method of an example of the present invention.

FIG. 3 is a schematic diagram showing the sputtering method of an example of the present invention. In a sputtering apparatus 20, the degree of vacuum in a vacuum chamber is controlled in the range of 10 to $10^{-4}$ Pa by a vacuum pump 28. Then, a power supply 21 applies a voltage of several hundred V to several kV between a conductive rubber laminate 25 or the vacuum chamber (ground) and a target 22, thereby producing plasma. The metal atoms and/or metal molecules are sputtered from the metal in the target 22 that has been cooled with a cooling water 23 while a shutter 24 is open. Thus, the metal atoms and/or metal molecules are deposited on the surface of the conductive rubber laminate 25 supported by a support member 26. In this case, an argon (Ar) gas 27 is injected in the vacuum, and a direct voltage is applied to the laminate and the metal block. Consequently, the ionized argon strikes the metal block, from which the metal material is ejected and deposited on the laminate to form a metal coating.

Figure 5:
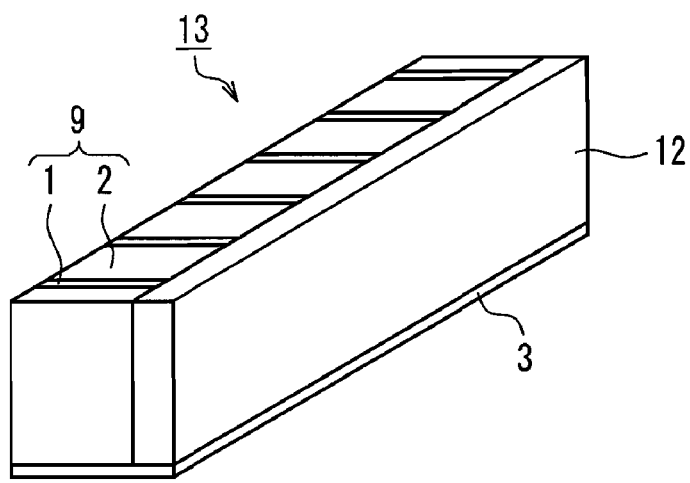
FIG. 5 is a perspective view of a metal-integral conductive rubber component of another example of the present invention, in which a support rubber layer is disposed on one side of a laminate.
Figure 6:
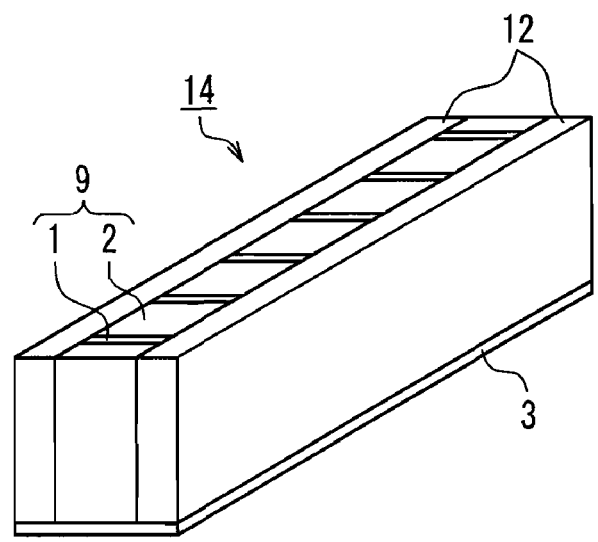
FIG. 6 is a perspective view of a metal-integral conductive rubber component of yet another example of the present invention, in which support rubber layers are disposed on both sides of a laminate.

FIG. 5 shows a conductive rubber component 13 provided with a metal coating of another example of the present invention, in which a support rubber layer 12 is disposed on one side of the conductive rubber laminate 9. FIG. 6 shows a conductive rubber component 14 provided with a metal coating of yet another example of the present invention, in which the support rubber layers 12 are disposed on both sides of the conductive rubber laminate 9. In FIGS. 5 and 6, the support rubber layer 12 is insulating rubber with a JIS hardness (JIS K6253) of 55 degrees or less. The support rubber layer 12 that is in the uncured state and has a JIS hardness of 55 degrees or less is formed on at least one side of the conductive rubber laminate 9 of the conductive rubber layers 1 and the insulating rubber layers 2, and then cured under pressure, so that these layers are integrated at their boundaries by a curing reaction. In other words, the support rubber layer 12 and each of the conductive rubber layers 1 and the insulating rubber layers 2 self adhere to one another by cross-linking. Thus, the conductive rubber components 13, 14 are provided. The conductive rubber laminate 9 preferably has a height of 50 to 200 mm, a length of 50 to 200 mm, and a thickness (width) of 50 to 200 mm. The thickness (width) of the support rubber layer 12 is preferably 0.2 to 10 mm, and more preferably 0.4 to 2.0 mm.

Figures 7A, 7B:
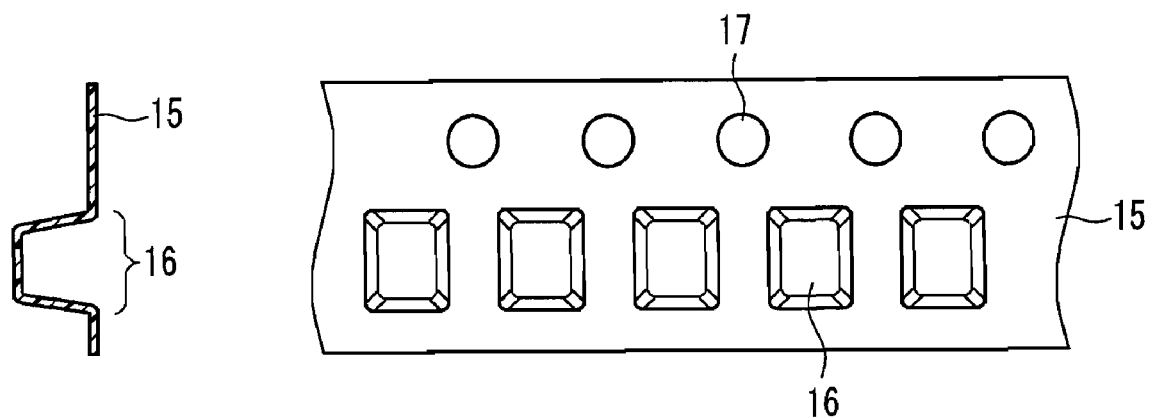
FIG. 7A is a cross-sectional view of a carrier tape for accommodating a metal-integral conductive rubber component of an example of the present invention.
FIG. 7B is a plan view of the carrier tape in FIG. 7A
Figure 8:
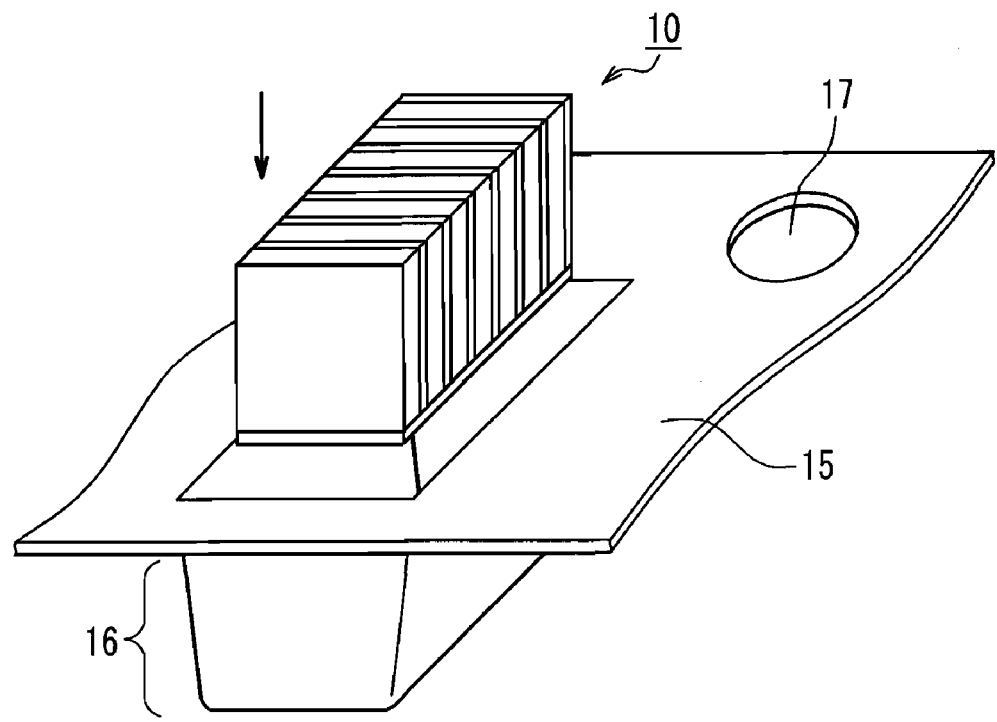
FIG. 8 is a diagram for explaining a metal-integral conductive rubber component accommodated in a carrier tape of an example of the present invention.

FIG. 7A is a cross-sectional view of a carrier tape 15 for accommodating a metal-integral conductive rubber component of an example of the present invention. FIG. 7B is a plan view of the carrier tape 15 in FIG. 7A. The carrier tape 15 has recesses 16 for accommodating the metal-integral conductive rubber components. The carrier tape 15 also has feed holes 17 spaced at predetermined intervals, and therefore can be fed automatically. FIG. 8 is a diagram for explaining a metal-integral conductive rubber component accommodated in the carrier tape of an example of the present invention. The metal-integral conductive rubber component 10 is allowed to fall in the direction of the recess 16 (indicated by the arrow in FIG. 8) and thus is accommodated in the recess 16.

EXAMPLES

Hereinafter, the present invention will be described in more detail by way of examples. The present invention is not limited to the following examples.

Example 1

As shown in FIGS. 1 and 2, a laminate was configured so that the conductive rubber layers and the insulating rubber layers are laminated alternately in parallel. A conductive rubber material used for the laminate was produced in the following manner. 100 parts by weight of electrical insulating silicone rubber KE530U (product name, manufactured by Shin-Etsu Chemical Co., Ltd.) was mixed with 300 parts by weight of a conductive filler, i.e., a silver coated glass powder S3000 (product name, manufactured by Toshiba-Ballotini Co., Ltd.) having an average particle size of 20 μm. Then, the mixture and 5 parts by weight of a curing agent RC-4 (product name, manufactured by Dow Corning Toray Silicone Co., Ltd.) containing 50 wt % of 2,5-dimethyl-2,5-di(t-butylperoxy)hexane were kneaded homogenously. The volume resistivity of this compound was measured in accordance with ASTM D991 and was 0.07 Ω·cm. Subsequently, this compound was rolled with a reduction roll into a sheet having a thickness of 5 mm.

Next, an insulating rubber material used for the laminate was produced in the following manner. 100 parts by weight of silicone rubber SH861U (product name, manufactured by Dow Corning Toray Silicone Co., Ltd.) and 1 part by weight of a curing agent RC-4 (product name, manufactured by Dow Corning Toray Silicone Co., Ltd.) containing 50 wt % of 2,5-dimethyl-2,5-di(t-butylperoxy)hexane were kneaded homogenously. The volume resistivity of this compound was measured in accordance with JIS-K6249 and was $2 \times 10^{14}$ Ω·cm. Subsequently, this compound was rolled between reduction rolls into a sheet having a thickness of 5 mm.

These two types of rolled sheets of conductive rubber and insulating rubber were bonded together. Then, the laminated sheet with a thickness of 10 mm was rolled to a thickness of 5 mm using a reduction roll. Further, the rolled sheet was divided into two equal parts, and one sheet was stacked on the other sheet so as to have a thickness of 10 mm. The similar rolling was repeated several times until the conductive layer finally had a thickness of 0.05 mm (and a volume resistivity of 0.2 Ω·cm or less) and the insulating layer finally had a thickness of 0.05 mm (and a volume resistivity of 100 M Ω·cm or more). The number of layers was increased such that the two layers were doubled to four layers, the four layers were doubled to eight layers, the eight layers were doubled to sixteen layers, and the sixteen layers were doubled to thirty-two layers . . . .

A plurality of uncured laminated bodies of the conductive rubber and the insulating rubber were stacked and placed in a mold, and then heated and cured at 150° C. for 4 hours while being compressed in the height direction at a compression ratio of 3%, thereby providing a cured laminated body.

The cured laminated body was sliced perpendicularly to the lamination direction at a thickness of 2.5 mm into laminated slices. Subsequently, the laminated slice was put in a hot-air circulating oven and subjected to a secondary curing process at 150° C. for 1 hour. The resultant laminated slice was 10 cm long, 10 m wide, and 2.5 mm thick.

Next, a silane coupling agent (3-methacryloxypropyltrimethoxysilane) was dissolved in isopropanol to provide a 10 wt % solution. This solution was applied to the surface of the laminated slice on which a metal coating was to be formed, and dried at room temperature (25° C.) for 1 hour, so that the above surface of the laminated slice was pretreated for adhesion.

Next, sputtering processing was performed. First, one side of this laminated slice was protected with a thin metal plate. Using the method shown in FIG. 3, a nickel coating with a thickness of 0.05 μm was formed on one side of the laminated slice.

Figure 4:
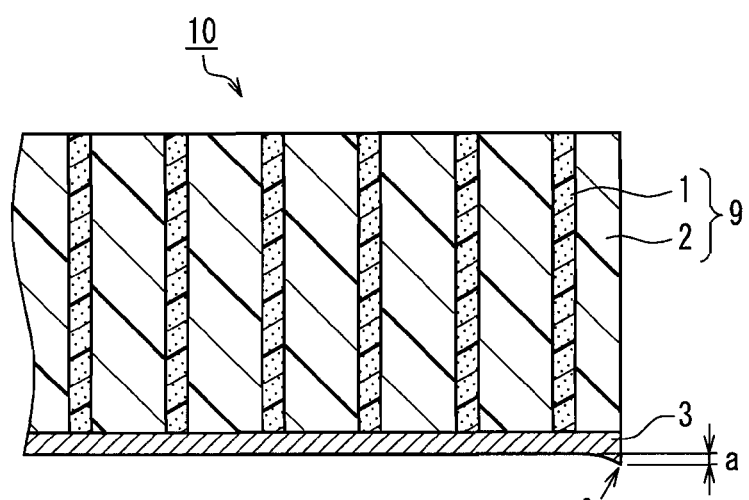
FIG. 4 is a cross-sectional view of a metal-integral conductive rubber component of an example of the present invention.

The conductive rubber sheet provided with the metal coating (10 cm long, 10 cm wide, and 2.5 mm thick) thus produced was fixed to a cutting panel with the metal coating facing down using a double-sided tape, and was cut to a width of 1 mm and a length of 3 mm with a cutting blade, resulting in metal-integral conductive rubber. The burr 8a (indicated by the arrow a in FIG. 4) in the cutting area of the metal-integral conductive rubber was measured with a laser displacement meter and was 8.6 to 1 μm. This value well satisfied a tolerance of 80 μm or less for burrs of a soldering surface-mount device. In FIG. 4, the conductive rubber layers 1 have a thickness of 0.03 mm, the insulating rubber layers 2 have a thickness of 0.07 mm, and the metal coating (nickel coating) 3 has a thickness of 0.05 μm and a surface flatness of 20 μm.

Figure 9:
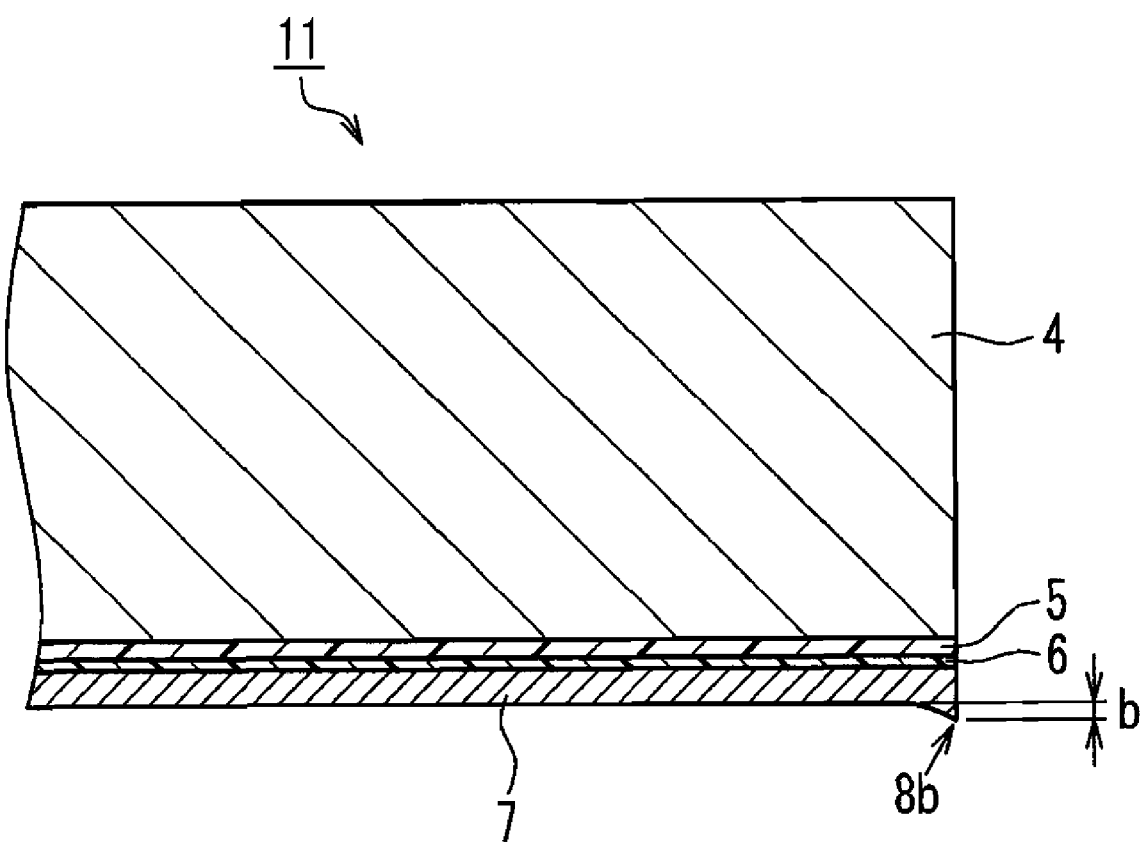
FIG. 9 is a cross-sectional view of a conventional laminate of conductive rubber and a metal foil.

The properties of the metal-integral conductive rubber were evaluated. The compression set of the metal-integral conductive rubber of this example was measured in accordance with the JIS K 6262 standard (compression ratio: 25%, holding time: 24 hours) and was 21%. In contrast, the compression set of the conventional conductive rubber (integrated with a metal foil) shown in FIG. 9 was 41% under the same measurement conditions. Moreover a change in resistance of the metal-integral conductive rubber of this example was 8% during 10% compression. In the case of the conductive rubber alone (i.e., the conductive rubber was not laminated with the insulating rubber), a change in resistance was 23% during 10% compression.

The metal-integral conductive rubber of this example was reflow mounted on a gold-plated electrode (1.2 mm long and 3.2 mm wide) of a printed wiring board. The peak temperature was 250° C., and the solder paste was Sn-3Ag-0.5Cu. The soldering strength between the metal-integral conductive rubber of this example and the electrode of the printed wiring board was 6 N. After reflow mounting of the metal-integral conductive rubber on the printed wiring board, the resistance value was 0.8Ω at a measuring current of 1.0 mA.

Example 2

As shown in FIGS. 1 and 2, a laminate was configured so that the conductive rubber layers and the insulating rubber layers are laminated alternately in parallel. A conductive rubber material used for the laminate was produced in the following manner. 100 parts by weight of electrical insulating silicone rubber KE530U (product name, manufactured by Shin-Etsu Chemical Co., Ltd.) was mixed with 300 parts by weight of a conductive filler, i.e., a silver coated glass powder S3000 (product name, manufactured by Toshiba-Ballotini Co., Ltd.) having an average particle size of 20 μm. Then, the mixture and 5 parts by weight of a curing agent RC-4 (product name, manufactured by Dow Corning Toray Silicone Co., Ltd.) containing 50 wt % of 2,5-dimethyl-2,5-di(t-butylperoxy)hexane were kneaded homogenously. The volume resistivity of this compound was measured in accordance with ASTM D991 and was 0.07 Ω·cm. Subsequently, this compound was rolled with a reduction roll into a sheet having a thickness of 5 mm.

Next, an insulating rubber material used for the laminate was produced in the following manner. 100 parts by weight of silicone rubber SH861U (product name, manufactured by Dow Corning Tray Silicone Co., Ltd.) and 1 part by weight of a curing agent RC-4 (product name, manufactured by Dow Corning Toray Silicone Co., Ltd.) containing 50 wt % of 2,5-dimethyl-2,5-di(t-butylperoxy)hexane were kneaded homogenously. The volume resistivity of this compound was measured in accordance with JIS-K6249 and was 2×10$^{14}$ Ω·cm. Subsequently, this compound was rolled between reduction rolls into a sheet having a thickness of 5 mm.

These two types of rolled sheets of conductive rubber and insulating rubber were bonded together. Then, the laminated sheet with a thickness of 10 mm was rolled to a thickness of 5 mm using a reduction roll. Further, the rolled sheet was divided into two equal parts, and one sheet was stacked on the other sheet so as to have a thickness of 10 mm. The similar rolling was repeated several times until the conductive layer finally had a thickness of 0.05 mm (and a volume resistivity of 0.2 Ω·cm or less) and the insulating layer finally had a thickness of 0.05 mm (and a volume resistivity of 100 M Ω·cm or more). The number of layers was increased such that the two layers were doubled to four layers, the four layers were doubled to eight layers, the eight layers were doubled to sixteen layers, and the sixteen layers were doubled to thirty-two layers . . . .

A plurality of uncured laminated bodies of the conductive rubber and the insulating rubber were stacked and placed in a mold, and then heated and cured at 150° C. for 4 hours while being compressed in the height direction at a compression ratio of 3%, thereby providing a cured laminated body.

The cured laminated body was sliced perpendicularly to the lamination direction at a thickness of 1.0 mm into laminated slices. The laminated slice of 10 cm long, 10 cm wide, and 1.0 mm thick was provided.

Next, a support rubber material was produced in the following manner. 100 parts by weight of silicone rubber SH851U (product name, manufactured by Dow Corning Toray Silicone Co., Ltd.) and 1 part by weight of a curing agent RC-4 (product name, manufactured by Dow Corning Toray Silicone Co., Ltd.) containing 50 wt % of 2,5-dimethyl-2,5-di(t-butylperoxy)hexane were kneaded homogenously. The volume resistivity of this compound was measured in accordance with JIS-K6249 and was 2×10$^{14}$ Ω·cm. Subsequently, this compound was rolled between reduction rolls into a sheet having a thickness of 1.1 mm, and the rolled sheet was punched to the same size (10 cm long and 10 cm wide) as that of the above laminated slice.

A plurality of alternating layers of the laminated slice and the uncured rolled sheet rubber thus produced were stacked and placed in a mold, and then heated and cured at 120° C. for 1 hour while being compressed in the height direction at a compression ratio of 3%, thereby providing a cured laminated body.

The cured laminated body was sliced perpendicularly to the lamination direction at a thickness of 2.0 mm into laminated slices. Subsequently, the laminated slice was put in a hot-air circulating oven and subjected to a secondary curing process at 150° C. for 1 hour. The resultant laminated slice was 10 cm long, 10 cm wide, and 2.0 mm thick.

Next, sputtering processing was performed. First, one side of this laminated slice was protected with a thin metal plate. Using the method shown in FIG. 3, a nickel coating with a thickness of 0.05 μm was formed on one side of the laminated slice.

The conductive rubber sheet provided with the metal coating (10 cm long, 10 cm wide, and 2.0 mm thick) thus produced was fixed to a cutting panel with the metal coating facing down using a double-sided tape, and was cut to a width of 2 mm and a length of 3 mm with a cutting blade, resulting in metal-integral conductive rubber (as shown in FIG. 6). The burr 8a (indicated by the arrow a in FIG. 4) in the cutting area of the metal-integral conductive rubber was measured with a laser displacement meter and was 8.6 to 1 μm. This value well satisfied a tolerance of 80 μm or less for burrs of a soldering surface-mount device. In FIG. 4, the conductive rubber layers 1 have a thickness of 0.03 mm, the insulating rubber layers 2 have a thickness of 0.07 mm, and the metal coating (nickel coating) 3 has a thickness of 0.05 μm and a surface flatness of 20 μm.

The properties of the metal-integral conductive rubber were evaluated. Under the conditions of the same size and a compression ratio of 20%, the load of the conductive rubber component 10 provided with the metal coating (i.e., the product having no support rubber layer) was 5.9 N, and the load of the conductive rubber component 13 provided with the metal coating (i.e., the product having a support rubber layer) was reduced to 3.3 N. Moreover, the compression set of the metal-integral conductive rubber of this example was measured in accordance with the JIS K 6262 standard (compression ratio: 25%, holding time: 24 hours) and was 10%. In this case, a change in resistance was 8% during 10% compression.

The metal-integral conductive rubber of this example was reflow mounted on a gold-plated electrode (2.2 mm long and 3.2 mm wide) of a printed wiring board. The peak temperature was 250° C., and the solder paste was Sn-3Ag-0.5Cu. The soldering strength between the metal-integral conductive rubber of this example and the electrode of the printed wiring board was 6N. After reflow mounting of the metal-integral conductive rubber on the printed wiring board, the resistance value was 0.8Ω at a measuring current of 1.0 mA.

As described above, it was confirmed that the metal-integral conductive rubber of each of the examples had the following advantages.

(1) The compression set properties are high because the conductive rubber layer is sandwiched between the electrical insulating rubber layers with good compression set properties.

(2) By sandwiching the conductive rubber layer between the electrical insulating rubber layers, the compression set properties are not likely to be reduced, and thus the resiliency during compression bonding can be maintained continuously. As a result, since the impact resilience of the product is maintained for a long period of time, an increase in contact resistance over time is reduced, and a stable electric connection can be achieved.

(3) The conductive rubber component has good low-load properties.

(4) A solderable metal coating is molded integrally with one surface of the product, so that the conductive rubber component provided with the metal coating can be reflowed on a printed wiring board.

INDUSTRIAL APPLICABILITY

The metal-integral conductive rubber component of the present invention is used, e.g., inside a portable telephone, and particularly suitable for an electric connection between a printed wiring board and a case or an electric connection between a printed wiring board and the inner surface of a frame on which a conductive metal evaporated film is formed.

DESCRIPTION OF THE REFERENCE NUMERALS

1 Conductive rubber layer
2 Insulating rubber layer
3 Metal coating
4 Conductive rubber
5 Conductive adhesive layer
6 Primer layer
7 Metal foil
8a, 8b Burr
9, 25 Conductive rubber laminate
10, 11 Conductive rubber component provided with metal coating
12 Support rubber layer
13, 14 Conductive rubber component provided with metal foil and support rubber layer
15 Carrier tape
16 Recess for accommodating conductive rubber component provided with metal coating
17 Feed hole
20 Sputtering apparatus
21 Power supply
22 Target
23 Cooling water
24 Shutter
26 Support member
27 Argon (Ar) gas
28 Vacuum pump

The invention claimed is:

1. A conductive rubber component comprising:
a laminate in which conductive rubber layers and insulating rubber layers are laminated alternately in parallel,
the conductive rubber layers and the insulating rubber layers being integrated at their boundaries by a cross-linking reaction between the conductive rubber layers and the insulating rubber layers,
the conductive rubber layers having a thickness of 0.01 mm to 1.0 mm and electrical conductivity such that a volume resistivity is $10^{-5}$ Ω·cm or more and 10 K Ω·cm or less, and
the insulating rubber layers having a thickness of 0.01 mm to 1.0 mm and electrical insulation properties such that a volume resistivity is 1 M Ω·cm or more and $10^{16}$ Ω·cm or less; and
a solderable metal coating integrated with at least one surface of the laminate that is perpendicular to an electrical conduction direction by deposition of at least one selected from atoms and molecules.

2. The conductive rubber component according to claim 1, wherein the metal coating has a thickness of 0.05 μm to 4 μm.

3. The conductive rubber component according to claim 1, wherein the metal coating is formed by a sputtering method.

4. The conductive rubber component according to claim 1, wherein an insulating support rubber layer with a JIS hardness (JIS K6253) of 55 degrees or less is disposed on at least one side of the laminate of the conductive rubber layers and the insulating rubber layers.

5. The conductive rubber component according to claim 1, wherein the surface provided with the metal coating and an opposite surface thereof are parallel to each other and substantially the same in shape.

6. The conductive rubber component according to claim 1, wherein the metal coating is any metal selected from the group consisting of gold, platinum, silver, copper, nickel, titanium, aluminum, and palladium or an alloy thereof.

7. The conductive rubber component according to claim 1, wherein the metal coating is either a single layer or two or more layers.

8. The conductive rubber component according to claim 1, wherein a flatness of a surface of the metal coating is 0.05 μm or less.

9. The conductive rubber component according to claim 1, wherein a silane coupling agent is applied to the surface of the laminate on which the metal coating is to be formed as an adhesion assistant to anchor the metal coating firmly with the laminate.

10. The conductive rubber component according to claim 1, wherein the conductive rubber component is accommodated in a carrier tape comprising recesses.

11. A method for using a conductive rubber component, comprising:

using the conductive rubber component to electrically connect a printed wiring board and a conducting surface on an inside of a resin body of a portable telephone, the conductive rubber component comprising:

a laminate in which conductive rubber layers and insulating rubber layers are laminated alternately in parallel, the conductive rubber layers and the insulating rubber layers being integrated at their boundaries by a cross-linking reaction between the conductive rubber layers and the insulating rubber layers, the conductive rubber layers having a thickness of 0.01 mm to 1.0 mm and electrical conductivity such that a volume resistivity is $10^{-5}$ Ω·cm or more and 10 K Ω·cm or less, and the insulating rubber layers having a thickness of 0.01 mm to 1.0 mm and electrical insulation properties such that a volume resistivity is 1 M Ω·cm or more and $10^{16}$ Ω·cm or less; and a solderable metal coating integrated with at least one surface of the laminate that is perpendicular to an electrical conduction direction by deposition of at least one selected from atoms and molecules.

12. The method according to claim 11, wherein the conductive rubber component is mounted on the printed wiring board by surface mounting using an adsorber and solder reflow.

13. The method according to claim 11, wherein the conductive rubber component is mounted automatically on the printed wiring board.

14. The method according to claim 11, wherein the conductive rubber component is accommodated in a carrier tape comprising recesses and feed holes spaced at predetermined intervals, and is fed to electrically connect the printed wiring board and the conducting surface on the inside of the resin body of the portable telephone.

15. The method according to claim 11, wherein the metal coating has a thickness of 0.05 μm to 4 μm.

16. The method according to claim 11, wherein the metal coating is formed by a sputtering method.

17. The method according to claim 11, wherein an insulating support rubber layer with a JIS hardness (JIS K6253) of 55 degrees or less is disposed on at least one side of the laminate of the conductive rubber layers and the insulating rubber layers.

18. The method according to claim 11, wherein a flatness of a surface of the metal coating is 0.05 μm or less.

19. The method according to claim 11, wherein a silane coupling agent is applied to the surface of the laminate on which the metal coating is to be formed as an adhesion assistant to anchor the metal coating firmly with the laminate.

20. A portable telephone comprising a conductive rubber component to electrically connect a printed wiring board and a conducting surface on an inside of a resin body of the portable telephone, the conductive rubber component comprising:

a laminate in which conductive rubber layers and insulating rubber layers are laminated alternately in parallel, the conductive rubber layers and the insulating rubber layers being integrated at their boundaries by a cross-linking reaction between the conductive rubber layers and the insulating rubber layers, the conductive rubber layers having a thickness of 0.01 mm to 1.0 mm and electrical conductivity such that a volume resistivity is $10^{-5}$ Ω·cm or more and 10 K Ω·cm or less, and the insulating rubber layers having a thickness of 0.01 mm to 1.0 mm and electrical insulation properties such that a volume resistivity is 1 M Ω·cm or more and $10^{16}$ Ω·cm or less; and a solderable metal coating integrated with at least one surface of the laminate that is perpendicular to an electrical conduction direction by deposition of at least one selected from atoms and molecules.

* * * * *